(12) United States Patent
Dvir et al.

(10) Patent No.: US 12,176,907 B2
(45) Date of Patent: Dec. 24, 2024

(54) SYSTEMS FOR AND METHODS OF JITTER REDUCTION

(71) Applicant: Avago Technologies International Sales Pte. Limited, Singapore (SG)

(72) Inventors: Amiad Dvir, Irvine, CA (US); Sourigno Outsama, Santa Rosa, CA (US); Da Xia, San Jose, CA (US); Vitaly Zborovski, Herzliya Pituah (IL)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 18/146,677

(22) Filed: Dec. 27, 2022

(65) Prior Publication Data

US 2024/0213988 A1    Jun. 27, 2024

(51) Int. Cl.
*H03L 7/081* (2006.01)
*H03L 7/099* (2006.01)

(52) U.S. Cl.
CPC .......... *H03L 7/0814* (2013.01); *H03L 7/0998* (2013.01)

(58) Field of Classification Search
None
See application file for complete search history.

(56) References Cited

U.S. PATENT DOCUMENTS

| | | | |
|---|---|---|---|
| 10,313,104 B2 | 6/2019 | Dvir et al. | |
| 10,409,322 B2* | 9/2019 | Liang | H03K 19/23 |
| 10,425,219 B2* | 9/2019 | Lim | H04L 7/0331 |
| 11,489,657 B1* | 11/2022 | Lin | H04L 25/242 |
| 2006/0083343 A1 | 4/2006 | Roederer et al. | |
| 2012/0033773 A1* | 2/2012 | Nedovic | H03L 7/0807 |
| | | | 375/371 |
| 2015/0146834 A1 | 5/2015 | Marshall et al. | |
| 2018/0278406 A1 | 9/2018 | Palusa et al. | |

* cited by examiner

*Primary Examiner* — Cassandra F Cox
(74) *Attorney, Agent, or Firm* — Foley & Lardner LLP

(57) ABSTRACT

A system for controlling jitter includes a first phase interpolator, a second phase interpolator, a first circuit configured to receive a first signal provided to the first phase interpolator, a second circuit configured to receive a second signal provided to the second phase interpolator, and a third circuit configured to provide a phase control signal in response to the first signal and the second signal. The first signal represents a first phase adjustment, and the second signal represents a second phase adjustment.

20 Claims, 6 Drawing Sheets

SYSTEMS FOR AND METHODS OF JITTER REDUCTION

FIELD OF THE DISCLOSURE

This disclosure generally relates to systems and methods for controlling the impact of jitter of a communications system, including but not limited to systems for and methods of jitter reduction.

BACKGROUND OF THE DISCLOSURE

Data communication systems often use a passive optical network (PON). A PON can use fiber-optic telecommunications technology to deliver broadband network access to end-customers. The PON can implement a point-to-multipoint topology in which a single optical fiber serves multiple endpoints by using unpowered or passive fiber optic splitters to divide the fiber bandwidth among the endpoints. The endpoints include an electronic data transceiver on a medium, such as a wired medium (e.g., a cable).

The data transceiver often includes a serializer/deserializer (SERDES) to transmit data on a recovered clock signal. The SERDES employs phase interpolators or similar functional circuits to offset a transmit (or receive) phase over time/frequency relative to a local timing reference so that the SERDES can transmit (or receive) data at the same frequency as a frequency of data transmitted (or received) from a far-end peer device as detected by the SERDES receiver (or transmitter). Phase interpolators (PIs) may be devices that can shift a clock signal in phase according to an analog or digital command. A PI can be used to achieve a transmit or receive frequency that is different from a frequency of a phase locked loop (PLL) or a multiple of such a frequency.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1A:
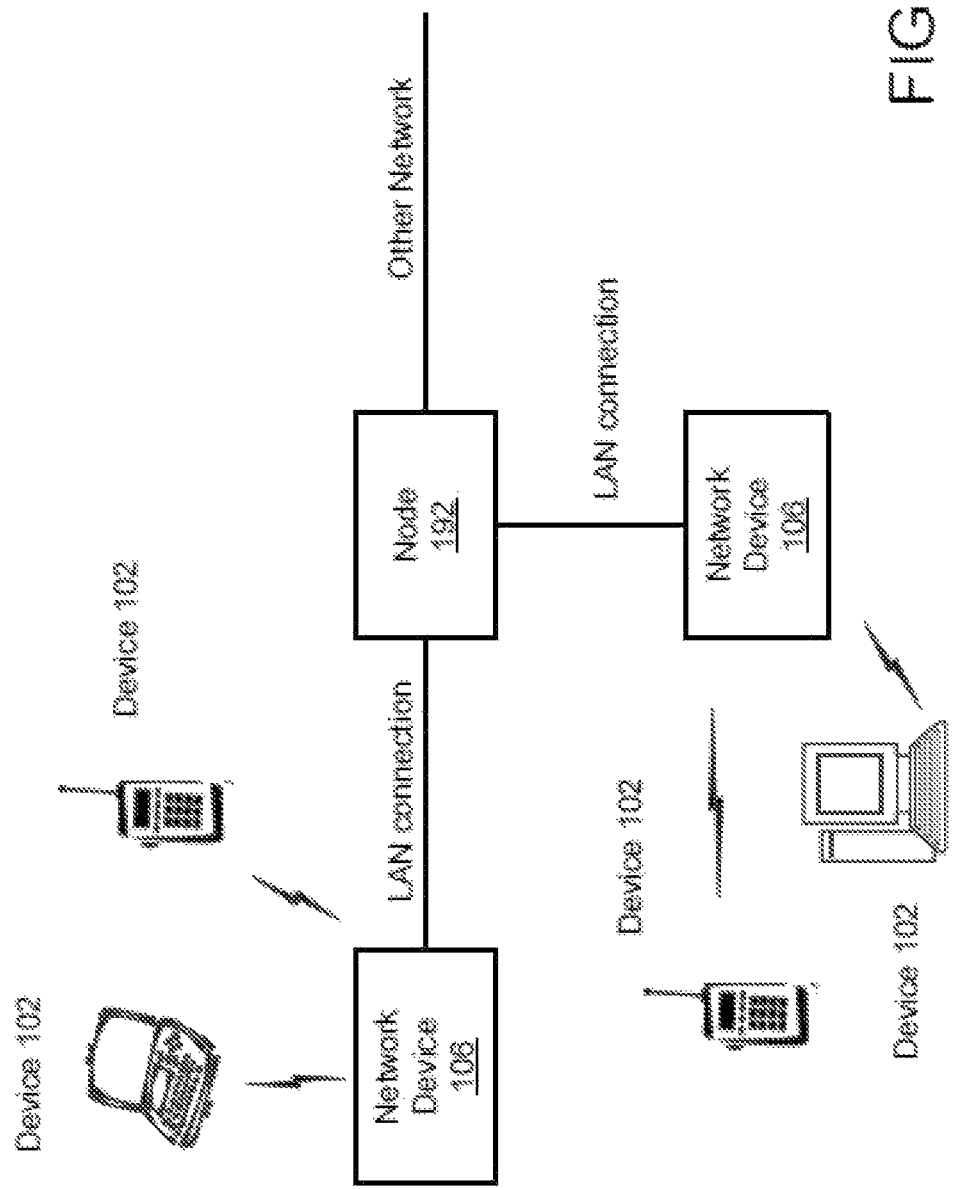
FIG. 1A is a schematic block diagram depicting an embodiment of a network environment including one or more wireless communication devices in communication with one or more devices or stations.

The details of various embodiments of the methods and systems are set forth in the accompanying drawings and the description below.

DETAILED DESCRIPTION

For purposes of reading the description of the various embodiments below, the following descriptions of the sections of the specification and their respective contents can be helpful:

Section A describes a network environment and computing environment which can be useful for practicing embodiments described herein; and Section B describes embodiments of systems and methods for controlling the impact of deterministic jitter.

Some embodiments relate to a system for controlling jitter. The system includes a first phase interpolator, a second phase interpolator, a first circuit configured to receive a first signal provided to the first phase interpolator, a second circuit configured to receive a second signal provided to the second phase interpolator, and a third circuit configured to provide a phase control signal in response to the first signal and the second signal. The first signal represents a first phase adjustment, and the second signal represents a second phase adjustment.

In some embodiments, the first circuit is configured to provide a trigger signal in response to the first signal having a first code. In some embodiments, the second circuit is configured to receive the trigger signal and provide the second signal to the third circuit in response to the trigger signal.

In some embodiments, the system further includes a fourth circuit configured to combine the phase control signal and a filtered version of the first signal to provide the second signal. In some embodiments, the first phase interpolator includes a mixer configured to receive the first signal. A mixer may refer to any circuit that provides a component in its output which is the product of the two input signals in some embodiments. Mixers can be active and passive circuits. Mixers can have an unbalanced, a single balanced or a double balanced mixer topology.

In some embodiments, the system further includes a fourth circuit configured to combine the phase control signal and a filtered version of the first signal to provide the second signal and a fifth circuit configured to provide the filtered version. In some embodiments, the fifth circuit comprises a loop timing filter.

In some embodiments, the system further includes a fourth circuit configured to combine the phase control signal and a filtered version of the first signal to provide the second signal, a fifth circuit configured to provide the filtered version, and a sixth circuit configured to provide the first signal. In some embodiments, the sixth circuit includes a clock and data recovery filter.

Some embodiments relate to a device. The device includes circuitry configured to adjust a receive clock signal in response to a first signal and adjust a transmit clock signal in response to a second signal. The circuitry is configured to provide the second signal in response to a third signal, and the circuitry is configured to provide the third signal in response to a sample of the second signal when the first signal is in a state.

In some embodiments, the first signal is provided to a first phase interpolator and the second signal is provided to a second phase interpolator. In some embodiments, the circuitry is configured to combine the third signal and a filtered version of the first signal to provide the second signal. In some embodiments, the circuitry includes a loop timing filter. In some embodiments, the circuitry includes a clock and data recovery (CDR) filter. In some embodiments, the state is a particular code.

Some embodiments relate to a method. The method includes receiving a first signal provided to a first phase interpolator. The first signal represents a first phase adjustment. The method also includes receiving a second signal provided to a second phase interpolator, the second signal representing a second phase adjustment. The method also includes providing a phase control signal in response to the first signal and the second signal. A phase adjustment may refer to a change a phase of a signal in some embodiments. A phase adjustment can be an increase or reduction in the phase of a signal by a fixed or proportional amount.

In some embodiments, the method further includes providing a trigger signal in response to the first signal having a first code. In some embodiments, the method further includes sampling the second signal in response to the trigger signal. In some embodiments, the method further includes combining the phase control signal and a filtered version of the first signal to provide the second signal.

A. Computing and Network Environment

Prior to discussing specific embodiments of the present solution, aspects of the operating environment as well as associated system components (e.g., hardware elements) are described in connection with the methods and systems described herein. Referring to FIG. 1A, an embodiment of a network environment is depicted. In brief overview, the network environment includes a wireless communication system that includes one or more base stations 106, one or more wireless communication devices 102 and a network hardware component or network hardware 192. The wireless communication devices 102 can for example include laptop computers 102, tablets 102, personal computers 102 and/or cellular telephone devices 102. The details of an embodiment of each wireless communication device and/or base station are described in greater detail with reference to FIGS. 1B and 1C. The network environment can be an ad hoc network environment, an infrastructure wireless network environment, a subnet environment, etc., in one embodiment.

Terms such as "wireless communication device", "user equipment," "mobile station," "mobile," "mobile device," "subscriber station," "subscriber equipment," "access terminal," "terminal," "handset," and similar terminology, can refer to a wireless device utilized by a subscriber or user of a wireless communication service to receive or convey data, control, voice, video, sound, gaming, or substantially any data-stream or signaling-stream. The foregoing terms can be utilized interchangeably in the present disclosure. Likewise, terms such as "access point (AP)," "wireless access point (WAP)," "base station," "base transceiver station", "Node B," "evolved Node B (eNode B or eNB)," home Node B (HNB)," "home access point (HAP)," and similar terminology, can be utilized interchangeably in the present disclosure, and refer to a wireless network component or apparatus that serves and receives data, control, voice, video, sound, gaming, or substantially any data-stream or signaling-stream from a set of wireless devices.

Referring again to FIG. 1A, the base stations 106 can be operably coupled to the network hardware 192 via local area network connections. The network hardware 192, which can include a router, gateway, switch, bridge, modem, system controller, appliance, etc., can provide a local area network connection for the communication system. Each of the base stations 106 can have an associated antenna or an antenna array to communicate with the wireless communication devices 102 in its area. The wireless communication devices 102 can register with a particular access point or base station 106 to receive services from the communication system (e.g., via a SU-MIMO or MU-MIMO configuration). For direct connections (e.g., point-to-point communications), some wireless communication devices 102 can communicate directly via an allocated channel and communications protocol. Some of the wireless communication devices 102 can be mobile or relatively static with respect to the access point or base station 106.

In some embodiments, a base station 106 includes a device or module (including a combination of hardware and software) that allows wireless communication devices 102 to connect to a wired network using LTE, Wi-Fi, and/or other standards. A base station 106 can be implemented, designed and/or built for operating in a wireless local area network (WLAN), such as in a cellular network. A base station 106 can connect to a router (e.g., via a wired network) as a standalone device in some embodiments. In other embodiments, a base station can be a component of a router. A base station 106 can provide multiple devices 102 access to a network. A base station 106 can, for example, connect to a wired Ethernet connection and provide wireless connections using radio frequency links for other devices 102 to utilize that wired connection. A base station 106 can be built and/or implemented to support a standard for sending and receiving data using one or more radio frequencies. Those standards and the frequencies they use can be defined by the IEEE or 3GPP for example. A base station 106 can be implemented and/or used to support cellular coverage, public Internet hotspots, and/or on an internal network to extend the network's signal (e.g., Wi-Fi) range.

In some embodiments, the base stations 106 can be used for (e.g., in-home or in-building) wireless networks (e.g., IEEE 802.11, Bluetooth, ZigBee, cellular, any other type of radio frequency based network protocol and/or variations thereof). Each of the wireless communication devices 102 can include a built-in radio and/or is coupled to a radio. Such wireless communication devices 102 and/or base stations 106 can operate in accordance with the various aspects of the disclosure as presented herein to enhance performance, reduce costs and/or size, and/or enhance broadband applications. Each wireless communication devices 102 can have the capacity to function as a client node seeking access to resources (e.g., data, and connection to networked nodes such as servers) via one or more base stations 106.

The network connections can include any type and/or form of network and can include any of the following: a point-to-point network, a broadcast network, a telecommunications network, a data communication network, a computer network. The topology of the network can be a bus, star, or ring network topology. The network can be of any such network topology as known to those ordinarily skilled in the art capable of supporting the operations described herein. In some embodiments, different types of data can be transmitted via different protocols. In other embodiments, the same types of data can be transmitted via different protocols.

Figure 1B:
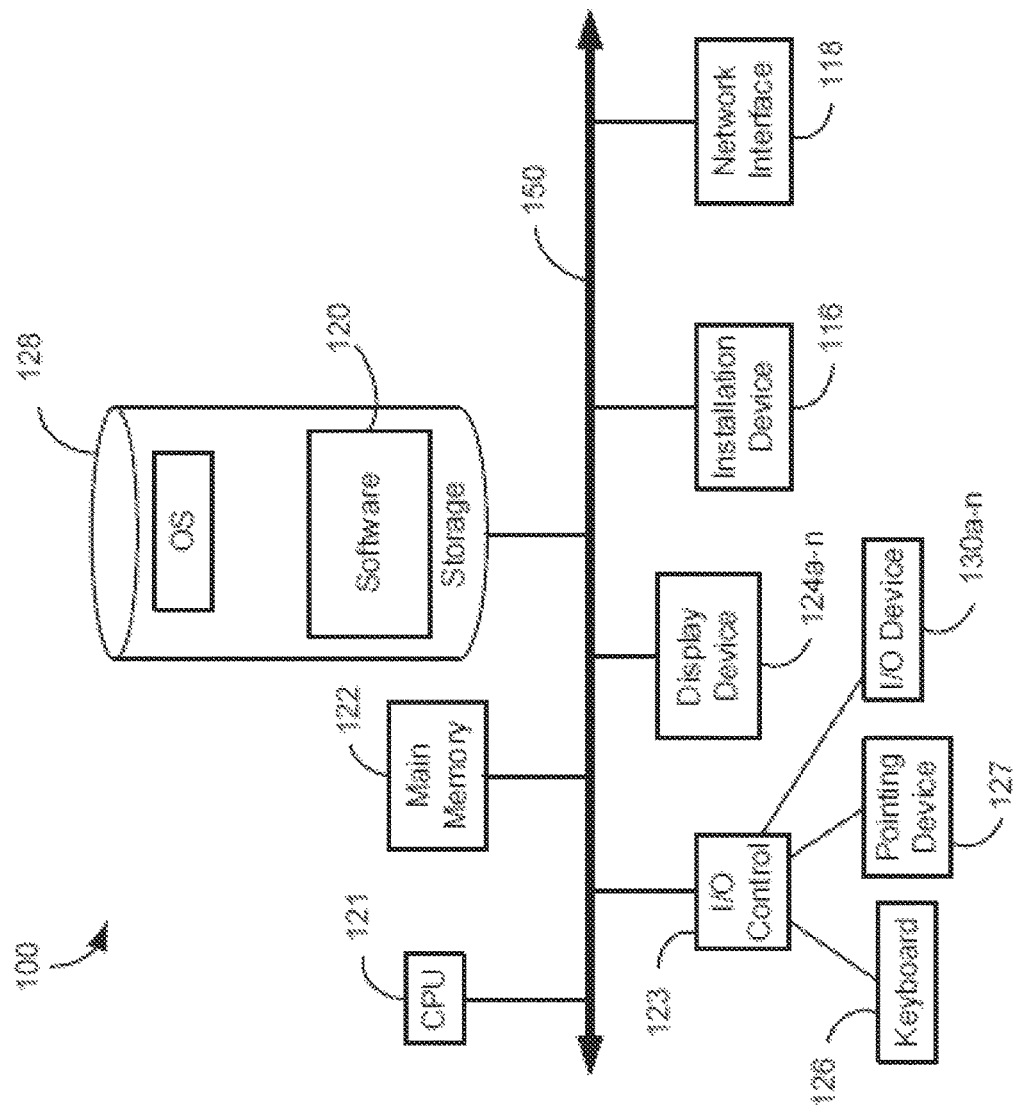
FIGS. 1B and 1C are schematic block diagrams depicting embodiments of computing devices useful in connection with the methods and systems described herein.
Figure 1C:
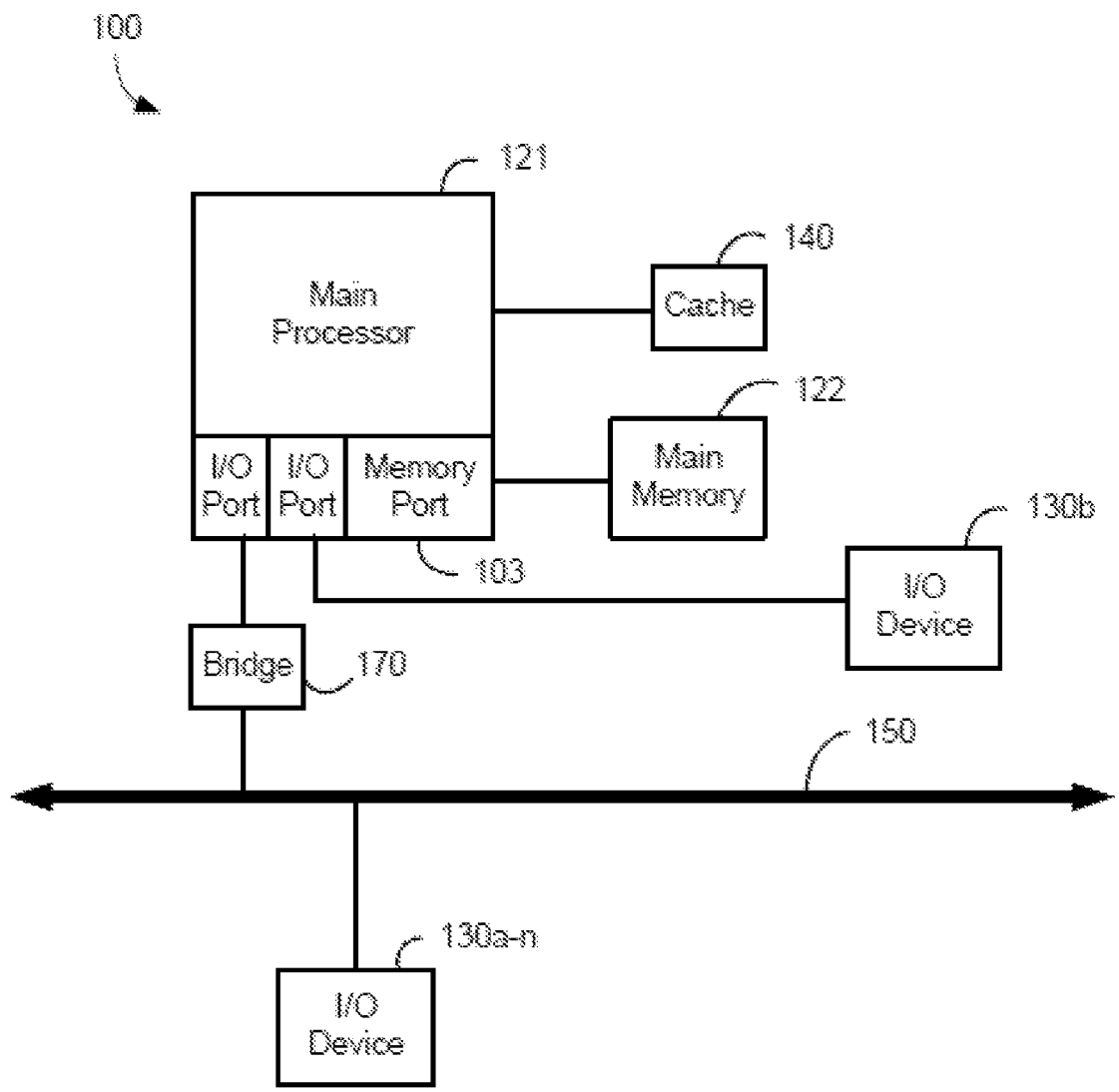

The communications device(s) 102 and base station(s) 106 can be deployed as and/or executed on any type and form of computing device, such as a computer, network device or appliance capable of communicating on any type and form of network and performing the operations described herein. FIGS. 1B and 1C depict block diagrams of a computing device 100 useful for practicing an embodiment of the wireless communication devices 102 or the base station 106. As shown in FIGS. 1B and 1C, each computing device 100 includes a central processing unit 121, and a main memory unit 122. As shown in FIG. 1B, a computing device 100 can include a storage device 128, an installation device 116, a network interface 118, an I/O controller 123, display devices 124*a*-124*n*, a keyboard 126 and a pointing device 127, such as a mouse. The storage device 128 can include, without limitation, an operating system and/or software. As shown in FIG. 1C, each computing device 100 can also include additional optional elements, such as a memory port 103, a bridge 170, one or more input/output devices 130*a*-130*n* (generally referred to using reference numeral 130), and a cache memory 140 in communication with the central processing unit 121.

The central processing unit 121 is any logic circuitry that responds to and processes instructions fetched from the main memory unit 122. In many embodiments, the central processing unit 121 is provided by a microprocessor unit, such as: those manufactured by Intel Corporation of Mountain View, California; those manufactured by International Business Machines of White Plains, New York; those manufactured by ARM Holdings, plc of Cambridge, England or those manufactured by Advanced Micro Devices of Sunnyvale, California. The computing device 100 can be based on any of these processors, or any other processor capable of operating as described herein.

Main memory unit 122 can be one or more memory chips capable of storing data and allowing any storage location to be directly accessed by the microprocessor or central processing unit 121, such as any type or variant of Static random access memory (SRAM), Dynamic random access memory (DRAM), Ferroelectric RAM (FRAM), NAND Flash, NOR Flash and Solid State Drives (SSD). The main memory unit 122 can be based on any of the above described memory chips, or any other available memory chips capable of operating as described herein. In the embodiment shown in FIG. 1B, the central processing unit 121 communicates with main memory unit 122 via a system bus 150 (described in more detail below). FIG. 1C depicts an embodiment of a computing device 100 in which the processor communicates directly with main memory unit 122 via a memory port 103. For example, in FIG. 1C the main memory unit 122 can be DRDRAM.

FIG. 1C depicts an embodiment in which the main processor or central processing unit 121 communicates directly with cache memory 140 via a secondary bus, sometimes referred to as a backside bus. In other embodiments, the main processor or central processing unit 121 communicates with cache memory 140 using the system bus 150. Cache memory 140 typically has a faster response time than main memory unit 122 and is provided by, for example, SRAM, BSRAM, or EDRAM. In the embodiment shown in FIG. 1C, the central processing unit 121 communicates with various I/O devices 130*a*-*n* via a local system or system bus 150. Various buses can be used to connect the central processing unit 121 to any of the I/O devices 130, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the central processing unit 121 can use an Advanced Graphics Port (AGP) to communicate with the display 124. FIG. 1C depicts an embodiment of a computer or computing device 100 in which the main processor or central processing unit 121 can communicate directly with I/O device 130*b*, for example via HYPERTRANSPORT, RAPIDIO, or INFINIBAND communications technology. FIG. 1C also depicts an embodiment in which local busses and direct communication are mixed: the central processing unit 121 communicates with I/O device 130*a* using a local interconnect bus while communicating with I/O device 131 directly.

A wide variety of I/O devices 130*a*-*n* and 131 can be present in the computing device 100. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices 130*a*-*n* can be controlled by an I/O controller 123 as shown in FIG. 1B. The I/O controller can control one or more I/O devices such as a keyboard 126 and a pointing device 127, e.g., a mouse or optical pen. Furthermore, an I/O device can also provide storage and/or an installation medium or installation device 116 for the computing device 100. In still other embodiments, the computing device 100 can provide USB connections (not shown) to receive handheld USB storage devices such as the USB Flash Drive line of devices manufactured by Twintech Industry, Inc. of Los Alamitos, California.

Referring again to FIG. 1B, the computing device 100 can support any suitable installation device 116, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 100 can further include a storage device, such as one or more hard disk drives or redundant arrays of independent disks, for storing an operating system and other related software, and for storing application software programs such as any program or software 120 for implementing (e.g., built and/or designed for) the systems and methods described herein. Optionally, any of the installation devices 116 could also be used as the storage device. Additionally, the operating system and the software can be run from a bootable medium.

Furthermore, the computing device 100 can include a network interface 118 to interface to the network 104 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax, LTE, LTE-A and direct asynchronous connections). In one embodiment, the computing device 100 communicates with other computing devices 100' via any type and/or form of gateway or tunneling protocol such as Secure Socket Layer (SSL) or Transport Layer Security (TLS). The network interface 118 can include a built-in network adapter, network interface card, PCMCIA network card, card bus network adapter, wireless network adapter, USB network adapter, modem or any other device suitable for interfacing the computing device 100 to any type of network capable of communication and performing the operations described herein.

In some embodiments, the computing device 100 can include or be connected to one or more display devices 124*a*-124*n*. As such, any of the I/O devices 130*a*-130*n* and/or the I/O controller 123 can include any type and/or form of suitable hardware, software, or combination of hardware and software to support, enable or provide for the connection and use of the display device(s) 124a-124n by the computing device 100. For example, the computing device 100 can include any type and/or form of video adapter, video card, driver, and/or library to interface, communicate, connect or otherwise use the display device(s) 124a-124n. In one embodiment, a video adapter can include multiple connectors to interface to the display device(s) 124a-124n. In other embodiments, the computing device 100 can include multiple video adapters, with each video adapter connected to the display device(s) 124a-124n. In some embodiments, any portion of the operating system of the computing device 100 can be implemented for using multiple displays or display devices 124a-124n. One ordinarily skilled in the art will recognize and appreciate the various ways and embodiments that a computing device 100 can be implemented to have one or more display devices 124a-124n.

In further embodiments, an I/O device 130a-n can be a bridge between the system bus 150 and an external communication bus, such as a USB bus, an Apple Desktop Bus, an RS-232 serial connection, a SCSI bus, a Fire Wire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 100 of the sort depicted in FIGS. 1B and 1C can operate under the control of an operating system, which control scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Washington; MAC OS, produced by Apple Computer of Cupertino, California; WebOS, produced by Research In Motion (RIM); OS/2, produced by International Business Machines of Armonk, New York; and Linux, a freely-available operating system distributed by Caldera Corp. of Salt Lake City, Utah, or any type and/or form of a Unix operating system, among others.

The computer system or computing device 100 can be any workstation, telephone, sensor, desktop computer, laptop or notebook computer, server, handheld computer, mobile telephone, or other portable telecommunications device, media playing device, a gaming system, mobile computing device, or any other type and/or form of computing, telecommunications or media device that is capable of communication. The computing device 100 has sufficient processor power and memory capacity to perform the operations described herein.

In some embodiments, the computing device 100 can have different processors, operating systems, and input devices consistent with the device. For example, in one embodiment, the computing device 100 is a smart phone, mobile device, tablet or personal digital assistant. In still other embodiments, the computing device 100 is an Android-based mobile device, an iPhone smart phone manufactured by Apple Computer of Cupertino, California, or a Blackberry or WebOS-based handheld device or smart phone, such as the devices manufactured by Research In Motion Limited. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Aspects of the operating environments and components described above will become apparent in the context of the systems and methods disclosed herein.

B. Controlling the Impact of Deterministic Jitter

Described herein are systems and methods for controlling the impact of jitter (e.g., deterministic jitter) in some embodiments. The jitter can be caused by non-ideal phase interpolators. In some embodiments, the PLL and the PI sources of deterministic jitter are addressed. For example, deterministic jitter generated by the receiver PLL and provided in the receiver based clock signal can be corrected by some embodiments of the systems and methods. In another example, deterministic jitter generated by the receiver PI and added to the coded offset can be corrected by some embodiments of the systems and methods. The coded offset is infused with non-linearities (e.g., differential nonlinearities (DNL), integral non-linearities (INL) and supply ripple, etc.) which are corrected in some embodiments. The correction can be made by adjusting the phase of the PI of the transmitter according to the Jitter to achieve a total reduction in the generated jitter. In some embodiments, the systems and methods reduce deterministic jitter associated with the coded offset and other sources. In some embodiments, jitter margins can be increased for other components because SERDES architecture dependent jitter is reduced. In some embodiments, a single crystal PON system on a chip can be used with the systems and methods.

Jitter may refer to a difference in an actual clock period and an ideal, expected or average clock period in some embodiments. Jitter can involve a deviation in, or displacement of, the signal pulses in a high-frequency digital signal (e.g., clock signal). In some embodiments, jitter corresponds to time domain instabilities. Jitter can have at least two characteristics: (1) frequency components of the variations; and (2) amplitude (e.g., amplitude of time components of the variation). When analyzing jitter of a serial data or a clock, signals are compared with a clean or noise-free clock signal or other signal that is a reference point in some embodiments. In some embodiments, to measure jitter of a serial data, an average ideal clock signal that is relevant to the serial data is measured.

Deterministic jitter may refer to jitter that is bounded, (e.g., with a minimum and maximum extent) in some embodiments. Deterministic jitter is generally different than random jitter, which is Gaussian in nature, and is unbounded. Deterministic jitter can include data-dependent jitter (DDj), periodic jitter (Pj), jitter caused by INL, jitter caused by DNL, jitter caused by supply ripple and combinations thereof in some embodiments.

In some embodiments, a control scheme is used to force an interference pattern that generates minimum jitter. In some embodiments, the systems and methods maintain an integer ratio of frequency between the receive clock and the transmit clock to provide an interference like pattern. In some embodiments, the integer ratio is provided so that a stable interference pattern is provided. An interference pattern or interference like pattern may refer to a pattern associated with the combination of two or more signals in some embodiments.

In some embodiments, a calibration module or circuit for a SERDES is configured to measure a phase offset between two independently operating PIs (each on its own clock domain, and in its own clock multiplication) and to tune receiver and transmitter transient phase position relative to each other. In some embodiments, the SERDES advantageously takes into account the characteristic of the non-linearities and tunes the time domain characteristic phase relationship between the receiver and transmitter PIs to achieve local minima in the characteristic interference. In some embodiments, the SERDES also uses PLL frequency offsetting to push the parts per million (PPM) offset to a position that minimizes Pj that rides over the noise floor of the PPL (e.g., supply tree related Pj). In some embodiments, the SERDES allows for super-positioning of the above techniques to minimize the Dj in a desired range of operation. Systems and methods for controlling the impact of periodic jitter caused by non-ideal phase interpolators are discussed in U.S. Pat. No. 10,313,104 incorporated herein by reference in its entirety.

Figure 2:
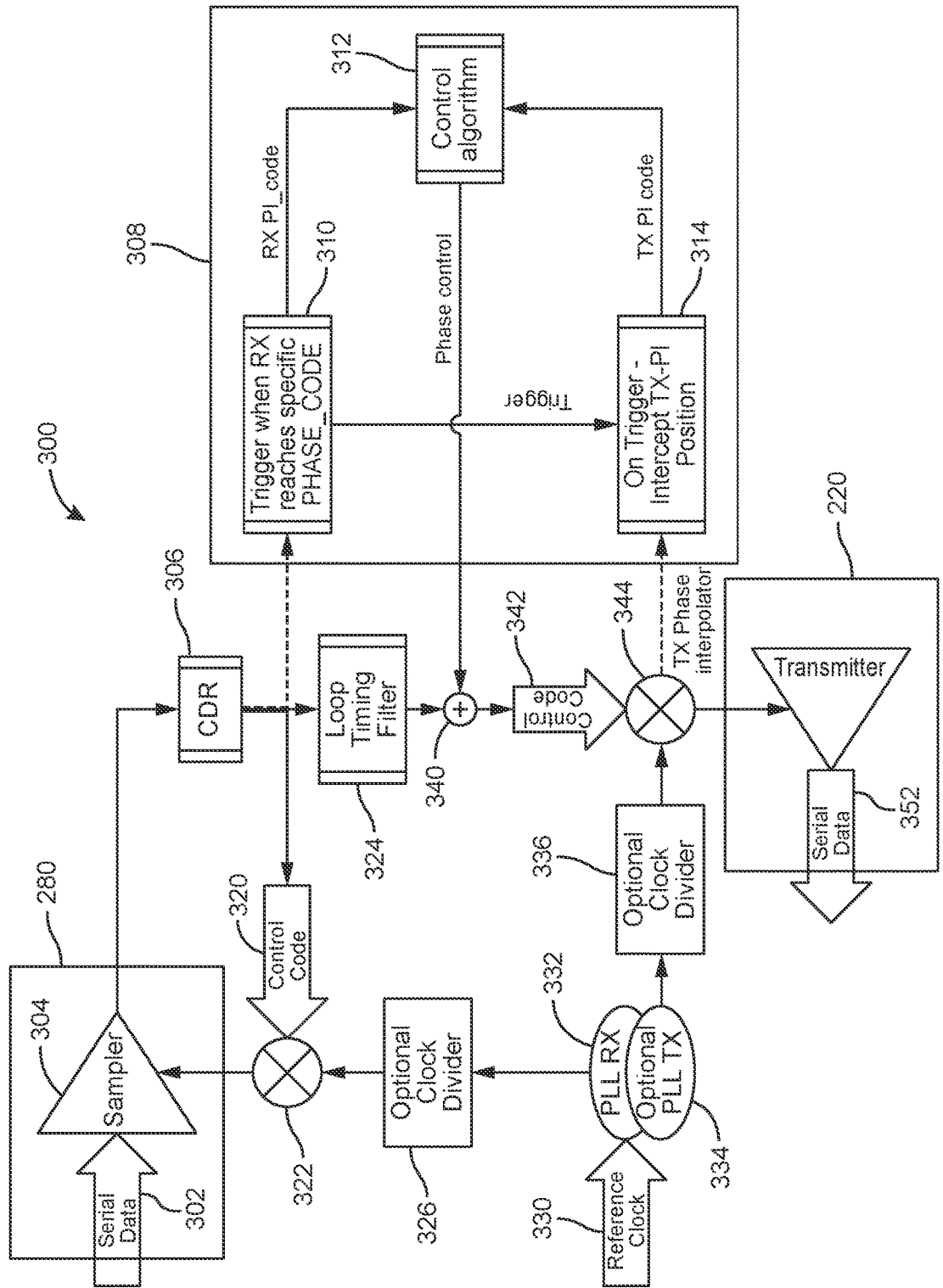
FIG. 2 is a schematic block diagram for a system for controlling the impact of jitter of according to some embodiments.

Referring to FIG. 2, an illustrative embodiment of a system 300 for controlling jitter (e.g. deterministic jitter) is depicted. System 300 can be part of a SERDES in some embodiments. In some embodiments, the system 300 includes a transmitter 220, a receiver 280, serial data input 302, a clock and data recovery (CDR) filter 306, a control and calibration circuit 308, a control code input 320, a phase interpolator (PI) 322, a loop timing filter 324, a clock divider 326, an adder 340, a control code input 342, a phase interpolator (PI)344, a clock divider 336, a receiver PLL 332, a reference clock input 330 coupled to a reference clock signal source, a transmitter PLL 334, and a serial data output 252. Transmit PLL 334, clock divider 326, and clock divider 326 are not included in system 300 in some embodiments. Control and calibration circuit 308 includes a trigger circuit 310, a trigger circuit 314, and a control circuit 312. Transmitter 220 receives parallel data and provides a serial data stream at serial data output 352, and receiver 280 includes a sampler 304 receives a serial bit stream at serial data input 302.

A transmitter may refer to any circuit for transmitting data across a medium (e.g., a cable) in some embodiments. Transmitter 220 can include circuitry for encoding, modulating, processing and providing data in a serial fashion. Transmitter 220 provides the data using a transmit clock signal in some embodiments. A transmit clock signal may refer to an oscillating signal (e.g., a square wave signal or signal of other form) that oscillates between at least two states (e.g., a high and a low state) and is used in the transmission of transmit data in some embodiments.

A receiver may refer to any circuit for receiving data from a medium (e.g., a cable) in some embodiments. Receiver 280 can include circuitry for decoding, demodulating, processing and receiving data form a medium. Receiver 280 receives the data using a receive clock signal in some embodiments. A receive clock signal may refer to an oscillating signal (e.g., a square wave signal or signal of other form) that oscillates between at least two states (e.g., a high and a low state) and is used in the reception of transmit data. A calibration circuit may refer to any circuit for providing signals that adjust a system to reduce jitter in some embodiments. A state may refer to any physical or virtual quantity or representation that varies with time or space or any other independent variable or variables in some embodiments. A state may be a particular code or combinations of codes in some embodiments.

In some embodiments, a reference clock source is coupled to the reference clock input 330 and generates a reference clock signal. In some embodiments, the PLL 332 and PLL 334 receive the reference clock signal to lock to a reference frequency of the reference clock signal. In some embodiments, the PLL 332 and PLL 334 each include a phase detector, a charge pump, a low pass filter, and/or a voltage controlled oscillator (VCO). In some embodiments, an output voltage of the low pass filter is a control voltage for the VCO so that the VCO generates a clock signal for PI 322 via clock divider 326 having a frequency that is determined by the control voltage. In some embodiments, the frequency control uses an analog filtration (e.g., a low pass filter) at the input to the VCO of the PLL 332. In some embodiments, the PLL 332 is a fractional-N phase-locked loop configured to receive a reference signal and provide a proportional signal and an integral signal. In some embodiments, an offset to the reference clock of the fractional-N PLL is achieved by obtaining a division of the frequency of the VCO and comparing the division to the reference clock signal to generate a signal that drives an analog filter (e.g., a low pass filter of the PLL 332). PLL 334 can employ similar components.

PLLs 332 and 334 can be any type circuit for locking a signal to a reference clock signal. PLLs 332 and 334 can be single or dual PLLs. Clock dividers 326 and 336 can be any type of circuit for dividing a frequency of a signal including but not limited to a prescaler, a frequency divider, a scaler, etc. Clock dividers 326 and 336 are integer or fractional clock dividers in some embodiments.

In some embodiments, the analog filters of PLLs 332 and 334 are replaced by a DAC which receives a digital input for tuning and/or modulation. In some embodiments, the DAC outputs an analog frequency offset to an input of the VCO so that the VCO generates clock signals having a frequency that is determined by the analog frequency offset. In some embodiments, a center frequency of PLLs 332 and 334 is a center frequency of the VCO. In some embodiments, PLLs 332 and 334 receive similar signals and provide a clock signal for PI 344 via clock divider 336 having a frequency that is determined by the control voltage.

In some embodiments, PI 322 and PI 344 can be circuitry configured to generate a desired phase shift/phase interpolation from a control signal/word]. PI 322 and PI 344 can each represent a single PI or multiple PIs and can be implemented as mixers configured to generate phase offset clock signals for sampler 304 and transmitter 220, respectively, in some embodiments. Sampler 304 samples the serial data at serial data input in response to the phase offset clock signal from PI 322. Transmitter samples serial data for transmission a serial data output 352 in response to the phase offset clock signal from PI 344. A PI or phase interpolator may refer to any circuit that adjusts phase of a signal according to an analog or digital command or signal in some embodiments. A PI can be used to achieve a transmit or receive frequency for signal that is different from a frequency of a phase locked loop (PLL), a multiple of such a frequency, or a phase in some embodiments. A transmit PI may refer to a PI configured to adjust transmit clock signal in some embodiments. A transmit PI may refer to a PI configured to adjust receive clock signal in some embodiments.

In some embodiments, the analog filter of the PLL is replaced by a digital to analog converter (DAC) which receives a digital input for tuning and/or modulation. In some embodiments, the DAC outputs an analog frequency offset to an input of the VCO so that the VCO generates a clock having a frequency that is determined by the analog frequency offset. In some embodiments, a center frequency of the PLL is a center frequency of the VCO. In some embodiments, PLL 334 receives similar signals and provides a clock signal for PI 344 via clock divider 336 having a frequency that is determined by the control voltage.

In some embodiments, PI 322 receives the clock signal from PLL 332 and control codes from control code input 320. Control codes for control code input 320 are provided from CDR filter 306. The control codes from CDR filter 306 are provided via loop timing filter 324 to summer or adder 340 in some embodiments. The control codes or signals can represent of a phase adjustment. The control codes or signals representing a phase adjustment may refer to any signal or command that causes a PI to adjust a phase corresponding to the phase adjustment in some embodiments. The control codes or signals representative of a phase adjustment can be control signals provided to one or more mixers configured as a PI (e.g., PIs322 and 344) in some embodiments.

In some embodiments, the PI 344 receives the clock signal from PLL 334 and control codes from control code input 342. Control codes for control code input 342 are provided by summer or adder 340. Adder 340 combines (e.g., sums) a phase control signal from control and calibration circuit 308 and control codes from CDR filter 306 and provides control codes to the control code input 342 in accordance with the phase control signal and the control codes. Combine or combining may refer to an operation where two signals are mixed or subjected to a mathematical operation involving both signals in some embodiments. Signals can be mixed or combined by various mathematical operations (multiply, add, subtract, divide, etc.) in some embodiments. A phase control signal may refer to a command or signal that adjusts a phase in some embodiments. In some embodiments, the phase control signal is provide to adjust control codes used to control phase in a PI (e.g., PI 344) in some embodiments.

CDR filter 306 is any circuit for providing control codes representing transient phase offset to apply to clock signals (e.g., sample clock signals) provided to receiver 280 and transmitter 220. In some embodiments, CDR filter 306 operates at loop frequencies (that are lower and often even some decades lower than the sampling clock). In some embodiments, the CDR filter 30 is implemented as an amplifier filter combination. In some embodiments, the CDR filter is provided in CMOS technology using passive low-pass filters (LPFs) or digital filter with adaptively adjusted bandwidth for automatically providing balance jitter tracking and jitter suppression. A CDR filter may refer to any circuit for providing codes representing phase adjustments in some embodiments.

In some embodiments, CDR filter 306 is configured to match the sampling clock from PI 322 to the receive data. The control codes provided to control code input 320 compensate for any jitter that is inside the frequency response of the CDR filter 306 in some embodiments. In some embodiments, the CDR filter 306 issues control codes or commands that contain the frequency and initial phase compensation (that is a fixed rotation of the code) and an inverse operation versus deterministic jitter (e.g., bounded uncorrelated jitter) generated in the PLL 332 and PI 322. CDR filter 306 generates a jitter/phase/frequency compensation for the local generated clock based on the incoming serial data, limited only by the jitter content in the serial received data in some embodiments.

In some embodiments, loop timing filter 324 is any circuit for receiving control codes and providing cleaner versions of the control codes for application to PI 344 configured as a transmit PI. In some embodiments, loop timing filter 324 includes passive filters (LPFs) with passive components or digital filters with active components or combinations thereof that provide a filtered version of the control codes provided to control code input 320. A filtered version of a signal or code may refer to a signal or code that has been provided through a filter in some embodiments (e.g., a CDR filter 306 or filter 324) in some embodiments. A loop timing filter may refer to any circuit for receiving a control signal or code and providing cleaner versions for application to another device or component. A code may refer to a signal (e.g., data) that has a particular state or value in some embodiments. In some embodiments, the code may cause another circuit to perform on operation or may represent a sensed value, time, condition, etc.

Figure 3:
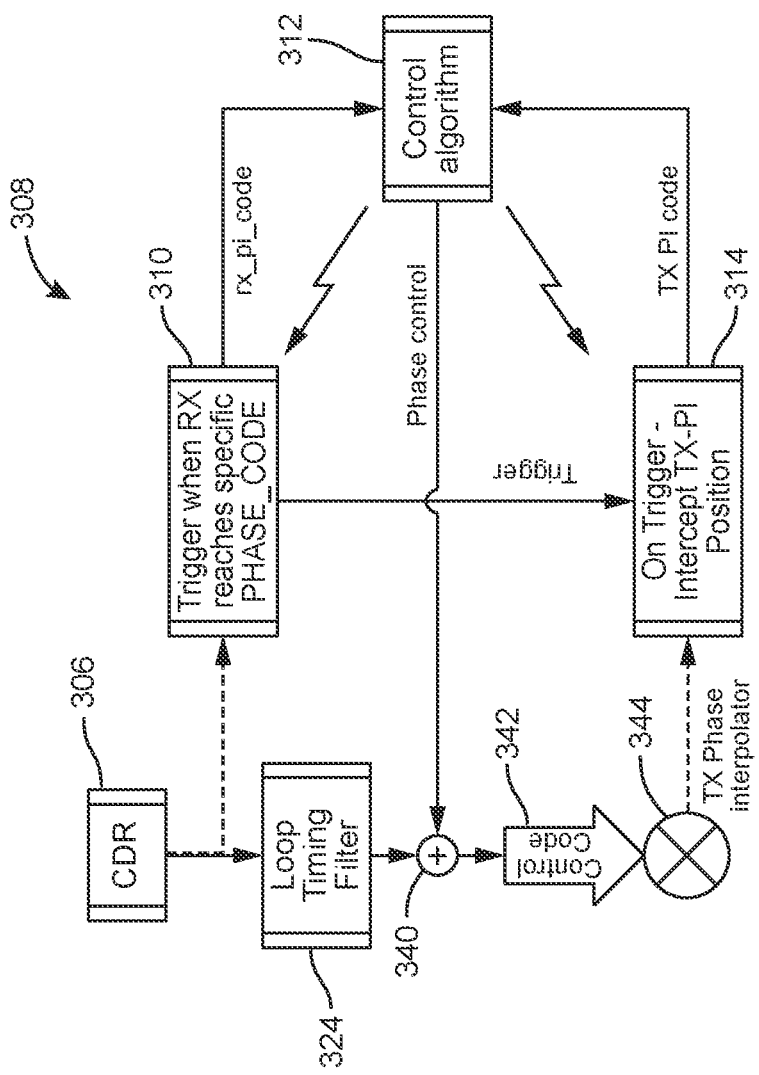
FIG. 3 is a more detailed schematic block diagram of a calibration circuit for the system for controlling the impact of jitter illustrated in FIG. 2 according to some embodiments.

With reference to FIGS. 2 and 3, control and calibration circuit 308 is configured to measure in real time the phase offset between the output of the PI 344 (e.g., representing transient phase position) and the output of the PI 322 (FIG. 2) (e.g., representing transient phase position) in some embodiments. Control and calibration circuit 308 is configured to force a deterministic jitter from the transmit and receive PIs to a local minimum or local minima in some embodiments. In some embodiments, the control codes provided to PIs 322 and 344 are compared in real time or near real time using trigger circuits 310 and 314. When trigger circuit 310 detects a trigger point (e.g., a particular phase code), the trigger circuit 310 provides a trigger signal to trigger circuit 314. Control circuit 312 receives information from circuit 310 and information from circuit 314 at the trigger point and determines a difference representing the instantaneous phase offset between the outputs of PIs 322 and 344. In some embodiments, information from circuit 310 and information from circuit 314 are control codes from circuits 310 and 314, respectively. The control codes are sampled at the trigger point in some embodiments. Sampling may refer to taking a sample or copy of a signal or version thereof at a particular time or in response to a particular event in some embodiments. In some embodiments, the information gathered or captured by circuits 310 and 314 at the trigger point is the code words for PIs 322 and 344. In some embodiments, the trigger point is a special clock domain crossing that has to intercept the transmit phase read in synchronization with the receiver read. Other trigger points can be used. A trigger signal may refer to a signal that causes a circuit to perform one or more operations in some embodiments. For example, a trigger signal can cause circuit 314 to sample the signal at input 342 and provide the sampled signal to control circuit 312 and can cause circuit 310 to sample the signal from CDR filter 306 and provide the sampled signal to control circuit 312.

As both the transmit PI and receive PI are rotating all the time and the control codes are continuously changing (e.g., due to the operation of CDR filter 306 and filter 324), the instantaneous phase offset is used between the receiver 280 and transmitter 220 in some embodiments. In some embodiments, only instantaneous phase offset is used between the receiver 280 and transmitter 220. In some embodiments, the control circuit 312 employs a control algorithm that characterizes the long term phase offset between receiver PI and transmitter PI and can slowly add phase control to the transmitter 220 to control and align the phase offset between the receive section to the transmit section of system 300 to a desired value. In some embodiments, control circuit 312 is configured to provide a phase control signal to summer or adder 340 to maintain a ratio that ensures a local minimum of the interference pattern.

In some embodiments, the control circuit 312 uses the measurement of the transient relationship between the receiver PI and transmitter PI to characterize and/or tune the interference pattern. In some embodiments, faster and more accurate measurement and conclusion on the desired alignment can be achieved using multiple correlations (at different points) between the receiver and transmitter control codes. Control circuit 312 can utilize measurements with different rotation ratios in some embodiments. Multiple trigger points can be used in some embodiments.

In some embodiments, the communication system 300 is implemented as a field-programmable gate array, an application-specific integrated circuit, hardware, a software executing processor, state machines, and combinations thereof. In some embodiments, a processing circuit which is part of a SERDES provides operations as described herein. The processing circuit can be configured to perform filtering, triggering and jitter reduction operations in some embodiments. Instructions for the processing circuit can be stored in a non-transitory medium such as memory in some embodiments. The memory may be one or more devices (e.g., RAM, ROM, Flash memory, hard disk storage) for storing data and/or computer code for completing and/or facilitating the various processes described herein. The memory may be or include non-transient volatile memory, non-volatile memory, and non-transitory computer storage media. Memory may include database components, object code components, script components, or any other type of information structure for supporting the various activities and information structures described herein. Memory may be communicably coupled to the processor circuit. The hardware system may be implemented in many different ways and in many different combinations of hardware and software and circuit designs. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof.

The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. The integrated circuit package can be a combination of two or more packages in some embodiments.

Figure 4:
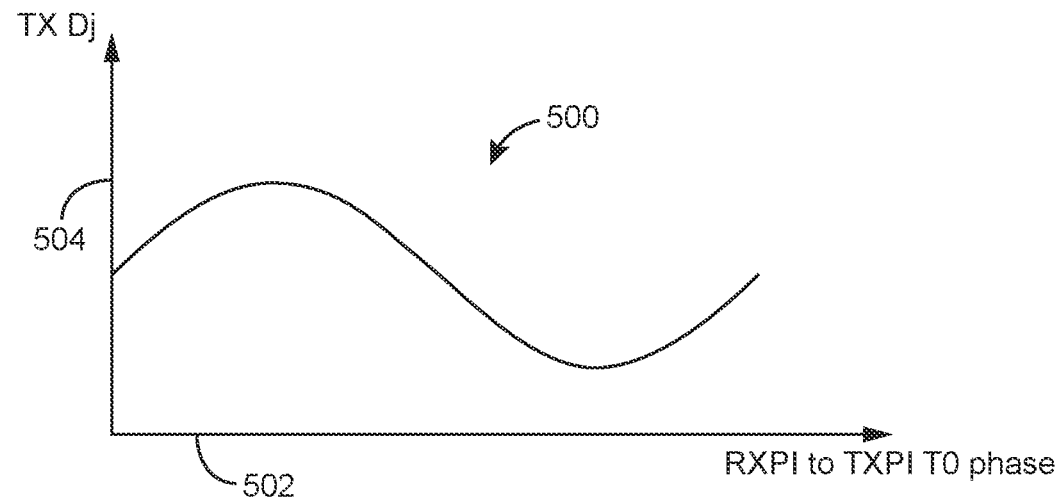
FIG. 4 is a waveform diagram depicting deterministic jitter versus phase difference for the system for controlling the impact of jitter illustrated in FIG. 2 according to some embodiments.
Figure 5:
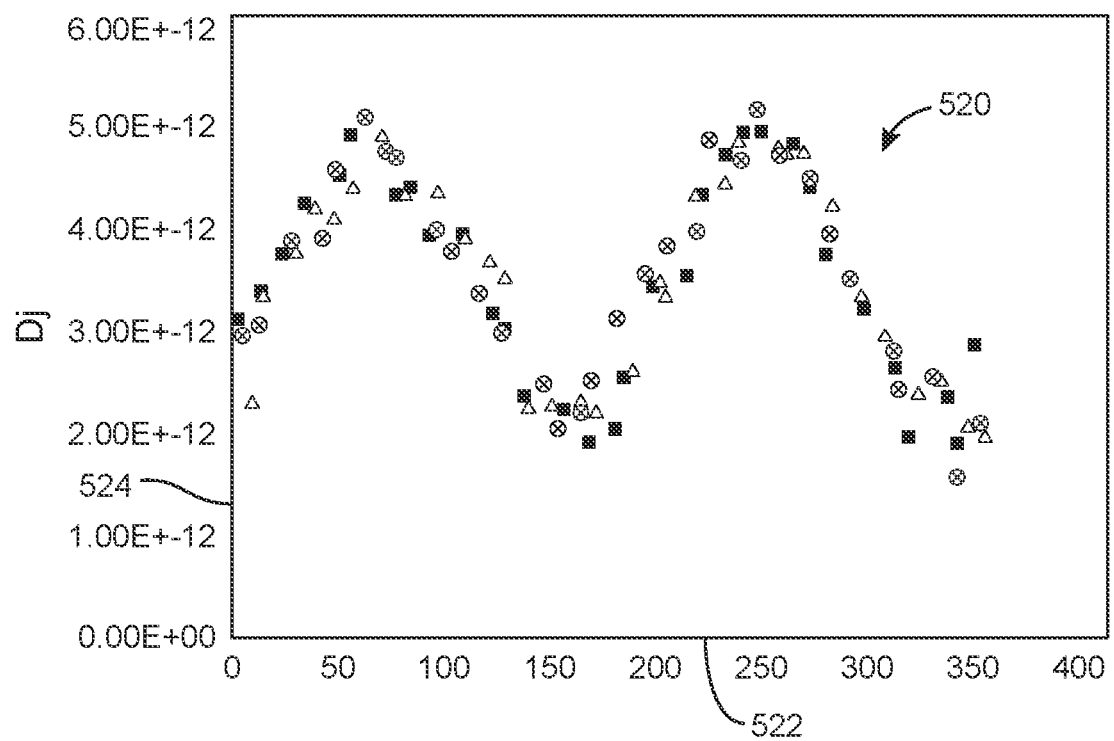
FIG. 5 is a scatter graph diagram for the system for controlling the impact of jitter illustrated in FIG. 2 according to some embodiments.

With reference to FIG. 4, a waveform 500 is provided on an X-axis 532 representing receiver PI to transmitter PI phase difference and a Y axis 504 representing transmitter deterministic jitter in parts for a milli unit interval. With reference to FIG. 5, a scatter graph 520 includes on an X-axis 522 representing receiver PI to transmitter PI phase difference in degrees and a Y axis 524 representing transmitter deterministic jitter in pico seconds. In some embodiments, control circuit 312 maintains an integer ratio of frequency between the receive clock signal to the transmit clock signal so that an interference like pattern emerges as shown in FIGS. 4 and 5. If the local positive phase error peak of the filtered code at input 342 meets a positive peak of non-linearity from the PLL 334 or 342 or from the actual code of the transmitter INL, the effect is a total phase error that is bigger than the two sources. If the same positive peak meets a negative peak of non-linearity in the transmitter 220, the sum of phase error is smaller than either of the two. As long as there is a meaningful ratio (1, 2, 4), the interference like pattern is stable and looks like waveform 500.

In some embodiments, the PI 322 and PI 344 continuously rotates the phase of the generated clock at an angular speed to generate M clocks (with M rotated clock phases) where M is an integer. In some embodiments, the continuous phase rotation implements fine frequency tuning, since frequency is the derivative of phase. In some embodiments, the PIs 322 and 344 includes a phase moving element that is capable of dynamically moving the phase of the signal.

In some embodiments, the CDR filter 306 includes a phase detector which detects data stream transitions and selects a phase associated with the transition detection. In some embodiments, the CDR filter 306 detects any phase or frequency offset between the incoming serial data (e.g., at the serial data input 302) and a lock clock (e.g., the reference clock signal from reference clock input 330, generated clock (e.g., from PLLS 332 and 334), or PI output (e.g., from PIs 322 and 344). In some embodiments, the CDR filter 306 includes measurement circuitry configured to measure a frequency difference between the incoming data and a local clock (e.g., reference clock signal, generated clock signal, or PI output clock signal). In some embodiments, the CDR filter 306 measures the frequency difference between the incoming data and the local clock in part per million (PPM) as an PPM offset of a PI (e.g., the M-phase PI) \ In some embodiments, the CDR filter 306 measures the frequency difference between the incoming data and the local clock in other measurement units (e.g., any ratio or absolute terms).

In some embodiments, a CDR filter (e.g., the CDR filter 306) instructs a PI (e.g., PI 322) to move its phase appropriately (in any combination of proportional ratio and/or integration) to achieve a fixed phase and frequency relationship (or difference or offset) between the clock output from the PI and the incoming data. In some embodiments, a clock and phase error detector is included in the CDR filter 306.

It should be noted that certain passages of this disclosure can reference terms such as "first" and "second" in connection with devices, frequencies, etc., for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities (e.g., devices) that can operate within a system or environment. Communicatively coupling may refer to a condition where two or more devices are in direct or indirect communication with each other over a wireless or wired medium in some embodiments.

It should be understood that the systems described above can provide multiple ones of any or each of those components and these components can be provided on either a standalone machine or, in some embodiments, on multiple machines in a distributed system. In addition, the systems and methods described above can be provided as one or more computer-readable programs or executable instructions embodied on or in one or more articles of manufacture. The article of manufacture can be a floppy disk, a hard disk, a CD-ROM, a flash memory card, a PROM, a RAM, a ROM, or a magnetic tape. In general, the computer-readable programs can be implemented in any programming language, such as LISP, PERL, C, C++, C #, PROLOG, or in any byte code language such as JAVA. The software programs or executable instructions can be stored on or in one or more articles of manufacture as object code.

Any implementation disclosed herein can be combined with any other implementation, and references to "an implementation," "some embodiments," "an alternate implementation," "various implementation," "one implementation" or the like are not necessarily mutually exclusive and are intended to indicate that a particular feature, structure, or characteristic described in connection with the implementation can be included in at least one implementation. Such terms as used herein are not necessarily all referring to the same implementation. Any implementation can be combined with any other implementation, inclusively or exclusively, in any manner consistent with the aspects and embodiments disclosed herein. In the above description, for the purposes of explanation, numerous details are set forth to provide a thorough understanding of the described embodiments. It will be apparent to one skilled in the art, however, that other embodiments may be practiced without some of these details. In other instances, structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features. Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present. Circuit or circuitry may refer to any active or passive component and connections thereto as well as combinations thereof. Circuitry may further include or access instructions (e.g., software or firmware instructions) for execution by the circuitry.

While the foregoing written description of the methods and systems enables one of ordinary skill to make and use various embodiments of these methods and systems, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:

1. A system for controlling jitter, the system comprising:
   a first phase interpolator;
   a second phase interpolator;
   a first circuit configured to receive a first signal provided to the first phase interpolator, the first signal representing a first phase adjustment;
   a second circuit configured to receive a second signal provided to the second phase interpolator, the second signal representing a second phase adjustment; and
   a third circuit configured to provide a phase control signal in response to the first signal and the second signal; and
   a fourth circuit configured to provide the second signal in response to the phase control signal to reduce jitter.

2. The system of claim 1, wherein the first circuit is configured to provide a trigger signal in response to the first signal having a first code.

3. The system of claim 2, wherein the second circuit is configured to receive the trigger signal and provide the second signal to the third circuit in response to the trigger signal.

4. The system of claim 3, wherein the fourth circuit is configured to combine the phase control signal and a filtered version of the first signal to provide the second signal.

5. The system of claim 1, wherein the fourth circuit is configured to combine the phase control signal and a filtered version of the first signal to provide the second signal.

6. The system of claim 1 wherein a phase of phase interpolation of the second phase interpolator is adjusted according to the jitter to achieve a reduction in the jitter.

7. The system of claim 1, wherein the
   fourth circuit is configured to combine the phase control signal and a filtered version of the first signal to provide the second signal and further comprising:
   a fifth circuit configured to provide the filtered version.

8. The system of claim 7, wherein the fifth circuit comprises a loop timing filter.

9. The system of claim 1, wherein the
   fourth circuit is configured to combine the phase control signal and a filtered version of the first signal to provide the second signal and further comprising:
   a fifth circuit configured to provide the filtered version; and
   a sixth circuit configured to provide the first signal.

10. The system of claim 9, wherein the sixth circuit comprises a clock and data recovery filter.

11. A device, comprising:
    a first circuit configured to adjust a receive clock signal in response to a first signal and adjust a transmit clock signal in response to a second signal;
    a second circuit configured to provide the second signal in response to a third signal; and
    a third circuit configured to provide the third signal in response to a sample of the second signal in response to the first signal being in a state.

12. The device of claim 11, wherein the first signal is provided to a first phase interpolator and the second signal is provided to a second phase interpolator.

13. The device of claim 12, wherein circuitry is configured to combine the third signal and a filtered version of the first signal to provide the second signal.

14. The device of claim 13, wherein the circuitry comprises a loop timing filter or a clock and data recovery (CDR) filter.

15. The device of claim 13, wherein the circuitry is configured to provide a phase control signal to maintain a ratio that ensures a local minimum of an interference pattern.

16. The device of claim 13, wherein the state comprises a particular code.

17. A method, comprising:
    receiving a first signal provided to a first phase interpolator, the first signal representing a first phase adjustment;
    receiving a second signal provided to a second phase interpolator, the second signal representing a second phase adjustment; and providing a phase control signal in response to the first signal and the second signal.

18. The method of claim 17, further comprising:
providing a trigger signal in response to the first signal having a first code.

19. The method of claim 18, further comprising:
sampling the second signal in response to the trigger signal.

20. The method of claim 17, further comprising:
combining the phase control signal and a filtered version of the first signal to provide the second signal.

* * * * *